(12) United States Patent
Hwang et al.

(10) Patent No.: US 6,549,556 B1
(45) Date of Patent: Apr. 15, 2003

(54) VERTICAL-CAVITY SURFACE-EMITTING LASER WITH BOTTOM DIELECTRIC DISTRIBUTED BRAGG REFLECTOR

(75) Inventors: Wen-Yen Hwang, Sugar Land, TX (US); Klaus Alexander Anselm, Sugar Land, TX (US); Stefan J. Murry, Houston, TX (US); Chih-Hsiang Lin, Sugar Land, TX (US); Jun Zheng, Houston, TX (US); James N. Baillargeon, Springfield, NJ (US)

(73) Assignee: Applied Optoelectronics, Inc., Sugar Land, TX (US)

( * ) Notice: Subject to any disclaimer, the term of this patent is extended or adjusted under 35 U.S.C. 154(b) by 0 days.

(21) Appl. No.: 10/002,997

(22) Filed: Nov. 30, 2001

Related U.S. Application Data

(60) Provisional application No. 60/250,773, filed on Dec. 1, 2000.

(51) Int. Cl.[7] ............................................... H01S 5/183
(52) U.S. Cl. .......................................... 372/96; 372/43
(58) Field of Search .................................... 372/96, 43

(56) References Cited

U.S. PATENT DOCUMENTS

| | | |
|---|---|---|
| 5,468,656 A | 11/1995 | Shieh et al. |
| 5,726,462 A * | 3/1998 | Spahn et al. .................. 257/76 |
| 5,748,665 A | 5/1998 | Jiang et al. |
| 5,901,168 A | 5/1999 | Baillargeon et al. |
| 5,985,686 A | 11/1999 | Jayaraman |
| 6,185,241 B1 * | 2/2001 | Sun ............................. 372/96 |

OTHER PUBLICATIONS

MacDougal, Michael H. et al., "Electrically–Pumped Vertical–Cavity Lasers with $Al_xO_y$–GaAs Reflectors," *IEEE Photonics Tech. Letters*, vol. 8, No. 3, (1996), pp. 310–312.

* cited by examiner

*Primary Examiner*—Paul Ip
*Assistant Examiner*—Dung Nguyen
(74) *Attorney, Agent, or Firm*—N. Stephan Kinsella

(57) ABSTRACT

A metal bonded vertical-cavity surface-emitting laser (VCSEL) structure with a bottom dielectric distributed Bragg reflector (DBR) mirror, and method for fabricating the VCSEL structure. The VCSEL structure consists a metal bonding layer disposed on a submount at a bottom side of the metal bonding layer; a bottom cavity mirror comprising a bottom dielectric distributed Bragg reflector (DBR) disposed within the metal bonding layer, the bottom dielectric DBR having a reflectance band including the lasing wavelength; a bottom current-spreading layer disposed on said bottom dielectric DBR and on a substantially flat, annular top surface of said metal bonding layer; a semiconductor active region disposed on the bottom current-spreading layer, said active region capable of stimulated emission at the lasing wavelength; and a top cavity mirror disposed above the active region and having a reflectance band including the lasing wavelength.

30 Claims, 6 Drawing Sheets

VERTICAL-CAVITY SURFACE-EMITTING LASER WITH BOTTOM DIELECTRIC DISTRIBUTED BRAGG REFLECTOR

CROSS-REFERENCES TO RELATED APPLICATIONS

This nonprovisional U.S. national application, filed under 35 U.S.C. §111 (a), claims, under 37 C.F.R. §1.78(a)(3), the benefit of the filing date of provisional U.S. national application no. 60/250,773, filed on Dec. 1, 2000 under 35 U.S.C. §111(b), the entirety of which is incorporated herein by reference.

This application is related to the U.S. Patent Application entitled "Vertical-Cavity Surface-Emitting Laser with Metal Mirror and Method of Fabrication of Same," filed on even date herewith (Nov. 30, 2001) under docket number PAT005US, inventor Wen-Yen Hwang, assignee Applied Optoelectronics, Inc., the entirety of which is incorporated herein by reference.

BACKGROUND OF THE INVENTION

1. Field of the Invention

This invention relates to vertical-cavity surface-emitting lasers (VCSELs) and, in particular, to the distributed Bragg reflectors (DBRs) used with VCSELs.

2. Description of the Related Art

The following descriptions and examples are not admitted to be prior art by virtue of their inclusion within this section.

Lasers have a wide range of industrial and scientific uses. There are several types of lasers, including gas lasers, solid-state lasers, liquid (dye) lasers, and free electron lasers. Semiconductor lasers are also in use. In semiconductor lasers, electromagnetic waves are amplified in a semiconductor superlattice structure. Semiconductor lasers may be diode lasers (bipolar) or non-diode lasers such as quantum cascade (QC) lasers (unipolar). Semiconductor lasers are used for a variety of applications and can be built with different structures and semiconductor materials, such as gallium arsenide (GaAs).

The use of semiconductor lasers for forming a source of optical energy is attractive for a number of reasons. Semiconductor lasers have a relatively small volume and consume a small amount of power as compared to conventional laser devices. Further, semiconductor lasers can be fabricated as monolithic devices, which do not require a combination of a resonant cavity with external mirrors and other structures to generate a coherent output laser beam.

A semiconductor laser typically comprises an active (optical gain) region sandwiched between two mirrors, one of which serves as the "exit" mirror. When the active region is pumped with an appropriate pumping energy, it produces photons, some of which resonate and build up to form coherent light in the resonant cavity formed by the two mirrors. A portion of the coherent light built up in the resonating cavity formed by the active region and top and bottom mirrors passes through one of the mirrors (the exit mirror) as the output laser beam.

Various forms of pumping energy may be utilized to cause the active region to begin to emit photons. For example, semiconductor lasers of various types may be electrically pumped (EP) (by a DC or alternating current), or pumped in other ways, such as by optical pumping (OP) or electron beam pumping. EP semiconductor lasers are typically powered by applying an electrical potential difference across the active region, which causes a current to flow therein. As a result of the potential applied, charge carriers (electrons and holes) are injected from opposite directions into an active region where recombination of electron and holes occurs. There are two kinds of recombination events, i.e. radiative and non-radiative, concurrently happening in the active region. When radiative recombination occurs, a photon is emitted with the same energy as the difference in energy between the hole and electron energy states. Some of those photons travel in a direction perpendicular to the reflectors of the laser. As a result of the ensuing reflections, the photons can travel through the active region multiple times.

Stimulated emission occurs when radiative recombination of an electron-hole pair is stimulated by interaction with a photon. In particular, stimulated emission occurs when a photon with an energy equal to the difference between an electron's energy and a lower energy interacts with the electron. In this case, the photon stimulates the electron to fall into the lower energy state, thereby emitting a second photon. The second photon will have the same energy and frequency as the original photon, and will also be in phase with the original photon. Thus, when the photons produced by spontaneous electron transition interact with other high energy state electrons, stimulated emission can occur so that two photons with identical characteristics are present. (Viewed as waves, the atom emits a wave having twice the amplitude as that of the original photon interacting with the atom.) If a sufficient amount of radiative recombinations are stimulated by photons, the number of photons traveling between the reflectors tends to increase, giving rise to amplification of light and lasing. The result is that coherent light builds up in the resonant cavity formed by the two mirrors, a portion of which passes through the exit mirror as the output laser beam.

Semiconductor lasers may be edge-emitting lasers or surface-emitting lasers (SELs). Edge-emitting semiconductor lasers output their radiation parallel to the wafer surface, while in SELs, the radiation output is perpendicular to the wafer surface. One type of SEL is the vertical-cavity surface-emitting laser (VCSEL). The "vertical" direction in a VCSEL is the direction perpendicular to the plane of the substrate on which the constituent layers are deposited or epitaxially grown, with "up" being typically defined as the direction of epitaxial growth. In some designs, the output laser beam is emitted out of the top side, in which case the top mirror is the exit mirror. In other designs, the laser beam is emitted from the bottom side, in which case the bottom mirror is the exit mirror. The exit mirror typically has slightly lower reflectance than the other mirror.

VCSELs have many attractive features compared to edge-emitting lasers, such as low threshold current, single longitudinal mode, a circular output beam profile, and scalability to monolithic laser arrays. The shorter cavity resonator of the VCSEL provides for better longitudinal mode selectivity, and hence narrower linewidths. Additionally, because the output is perpendicular to the wafer surface, it is possible to test fabricated VCSELs on the wafer before extensive packaging is done, in contrast to edge-emitting lasers, which must be cut from the wafer to test the laser. Also, because the cavity resonator of the VCSEL is perpendicular to the layers, there is no need for the cleaving operation common to edge-emitting lasers.

The VCSEL structure usually consists of an active (optical gain) region sandwiched between two mirrors, such as distributed Bragg reflector (DBR) mirrors. Both EP and OP VCSEL designs are possible. The two mirrors may be referred to as a top DBR and a bottom DBR. Because the optical gain is low in a vertical cavity design, the reflectors require a high reflectance in order to achieve a sufficient level of feedback for the device to lase. DBRs are typically formed of multiple pairs of layers referred to as mirror pairs; DBRs are sometimes referred to as mirror stacks. The DBR mirrors of a typical VCSEL can be constructed from dielectric (insulating) or semiconductor layers (or a combination of both, including metal mirror sections). The pairs of layers are formed of a material system generally consisting of two materials having different indices of refraction; for semiconductor DBRs, the layers are typically selected so that they are easily lattice matched to the other portions of the VCSEL, to permit epitaxial fabrication techniques.

For semiconductor DBRs, the number of mirror pairs per stack may range from 20–40 pairs to achieve a high percentage of reflectance, depending on the difference between the refractive indices of the layers. A larger number of mirror pairs increases the percentage of reflected light (reflectance). The difference between the refractive indices of the layers of the mirror pairs can be higher in dielectric DBRs, generally imparting higher reflectance to dielectric DBRs than to semiconductor DBRs for the same number of mirror pairs and overall thickness. Conversely, in a dielectric DBR, a smaller number of mirror pairs can achieve the same reflectance as a larger number in a semiconductor DBR. However, semiconductor DBRs, despite their lower reflectance/greater thickness, can be preferred because of comparative advantages in electrical conductivity, thermal conductivity, and manufacturability For example, in an EP VCSEL, a semiconductor DBR can be preferred, especially for the bottom DBR (between the substrate and active region), to conduct the pumping current through the active region, the bottom DBR, and into the substrate. Semiconductor DBRs may also be preferred for manufacturing reasons (e.g., it may be required if the initial epitaxial substrate is to be used for support) or fabrication reasons (e.g., an epitaxial, i.e. semiconductor, DBR may be needed if other epitaxial layers need to be grown on top of the DBR). A dielectric DBR may be employed for the bottom DBR; for example, by etching a via hole into the back side of the substrate to the active region and then depositing a dielectric DBR into the via hole. However, because of the large size of the via hole, this approach can exhibit poor thermal conductivity due to the long lateral path heat from the active region has to flow in before it reaches the substrate material at the side of the via hole.

Accordingly, there is often a tradeoff between using a lower reflectance, thicker semiconductor DBR, or a higher reflectance, thinner dielectric DBR which is more difficult to manufacture or which makes thermal conductivity more of an issue.

When properly designed, these mirror pairs will cause a desired reflectance at the lasing wavelength, at which wavelength the active region is also designed to have sufficient gain to permit lasing to occur. Typically in a VCSEL, the mirrors are designed so that the bottom DBR mirror (i.e. the one interposed between the substrate material and the active region) has nearly 100% reflectance, while the top (exit) DBR mirror has a reflectance that may be 98%–99.5% (depending on the details of the laser design). The partially reflective top (exit) mirror passes a portion of the coherent light built up in the resonating cavity formed by the active region and top and bottom mirrors. Of course, as noted above, in other designs, the bottom mirror may serve as the exit mirror and the top mirror has the higher reflectance.

VCSEL technology and related matters are discussed in further detail in *Vertical-Cavity Surface-Emitting Lasers: Design, Fabrication, Characterization, and Applications*, eds. Carl W. Wilmsen, Henryk Temkin & Larry A. Coldren, Cambridge: Cambridge University Press (1999); U.S. Pat. No. 5,468,656, Shieh et al., "Method of Making a VCSEL"; U.S. Pat. No. 5,985,686, Jayaraman, "Process for Manufacturing Vertical Cavity Surface Emitting Lasers Using Patterned Wafer Fusion and the Device Manufactured by the Process"; and MacDougal et al., "Electrically-Pumped Vertical-Cavity Lasers with AIO-GaAs Reflectors", IEEE Photonics Letters, vol. 8, No. 3, March. 1996.

There is, therefore, a need for improved VCSEL DBRs and -methods for fabricating same.

DETAILED DESCRIPTION

The present invention comprises an improved VCSEL structure, and method of fabricating same, the VCSEL employing at least a bottom dielectric DBR mirror instead of an extensive semiconductor DBR. This can reduce manufacturing costs associated with fabrication of extensive semiconductor DBR mirrors in VCSELs. The top DBR can also be a dielectric DBR, but need not be. In an embodiment, the present invention comprises a long-wavelength VCSEL fabricated on a substrate such as InP. The VCSEL and its bottom, dielectric DBR is fabricated such that thermal conductivity problems, such as those associated with the via hole approach described above, are reduced. In the present application, "bottom DBR" refers to the VCSEL cavity mirror between the active region and the supporting substrate, and having higher reflectance than the top DBR, which serves as the exit mirror. In an embodiment, a bottom metal mirror is deposited at the bottom end of the bottom DBR to provide a combined bottom mirror. A phase-matching or phase-shift layer may be disposed between the bottom DBR and the metal mirror to maximize the overall reflectance of the composite mirror. The structure, operation, and methods of fabrication of the present invention are described in further detail below with reference to FIGS. 1–6.

Figure 1:
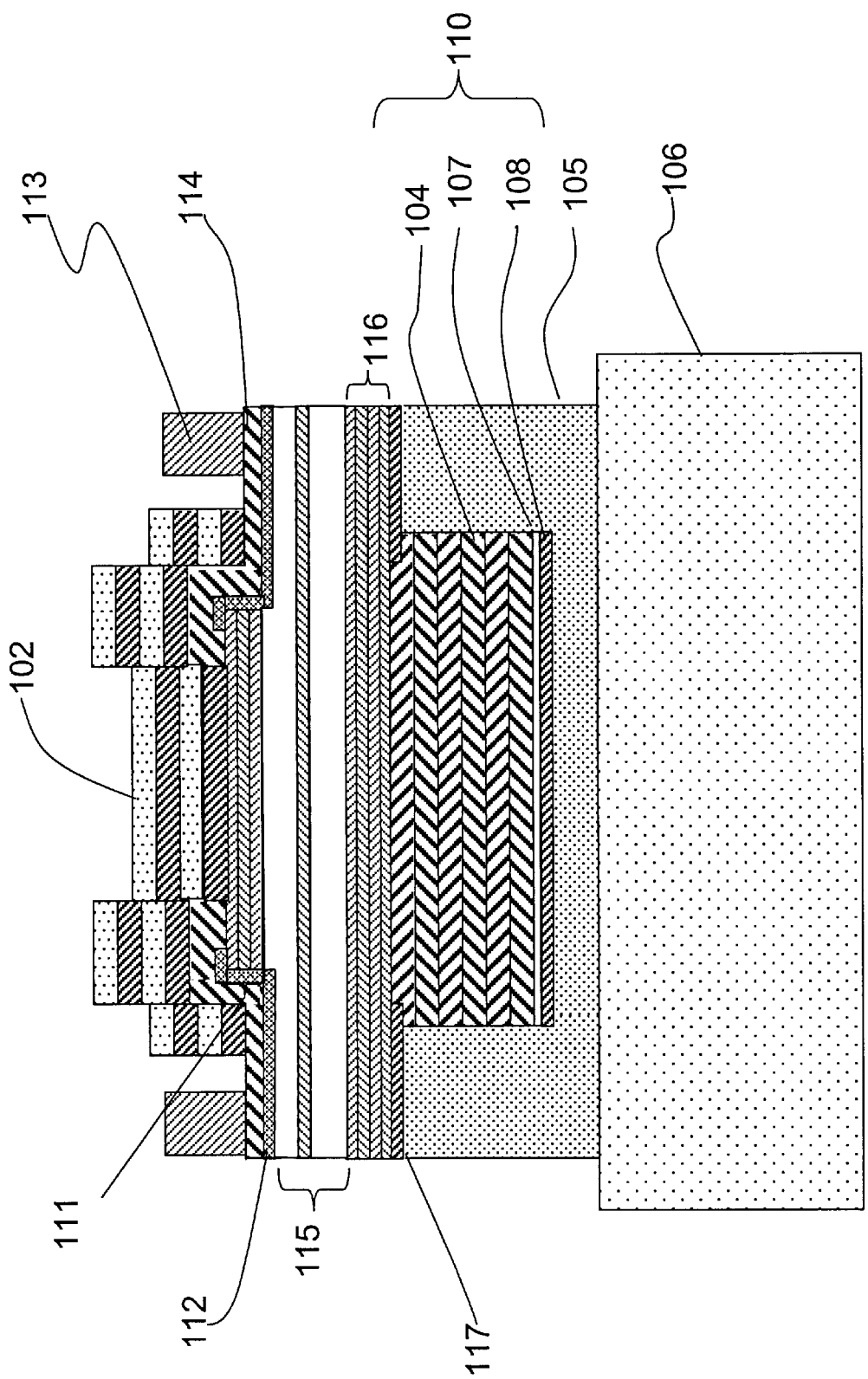
FIG. 1 is a schematic cross-sectional view of a layered vertical cavity surface emitting laser (VCSEL) structure in accordance with an embodiment of the invention.
Figure 2:
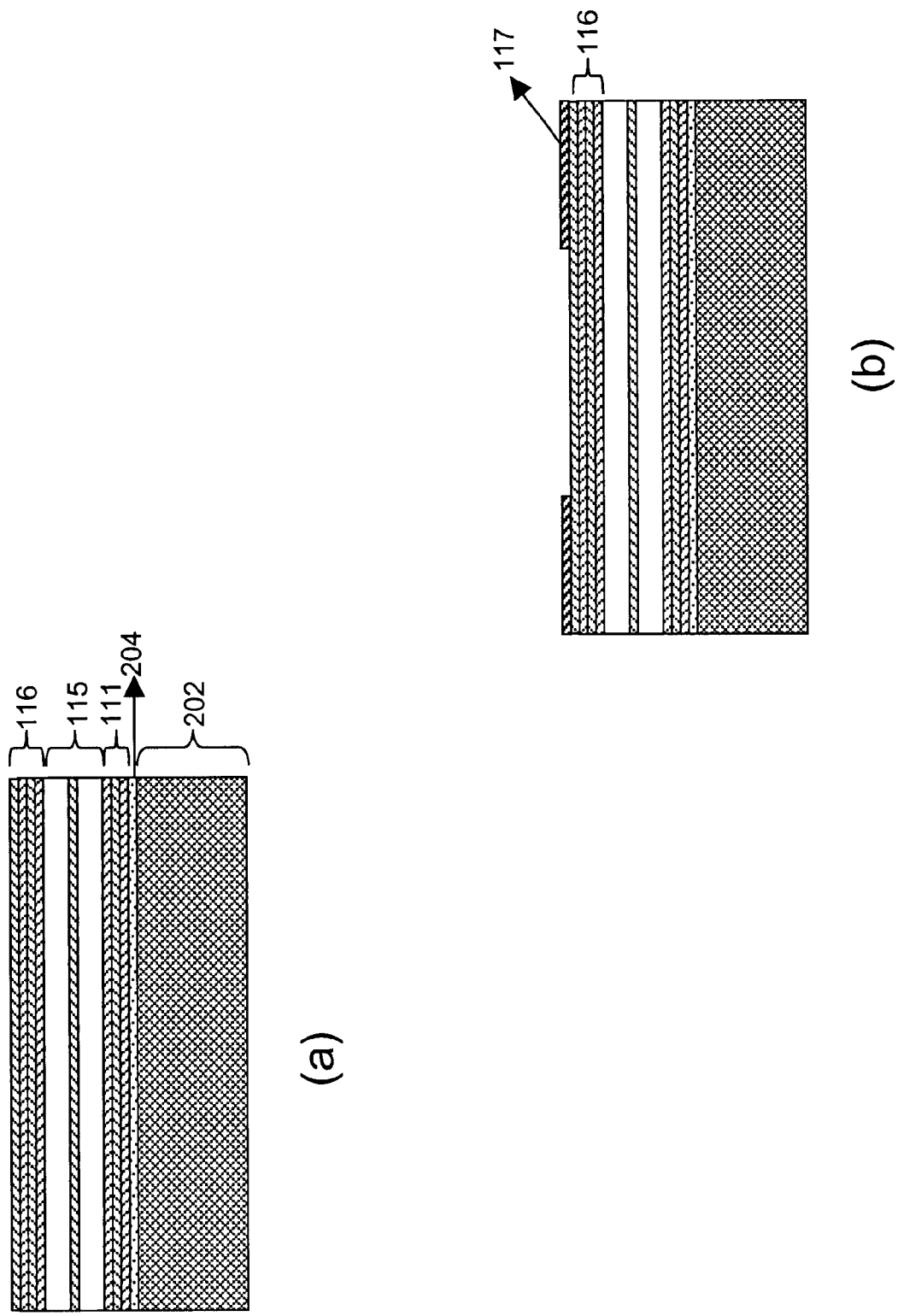
FIGS. 2–6 are schematic cross-sectional views at particular points during the growth and fabrication of a VCSEL structure in accordance with an embodiment of the invention.
Figure 3:
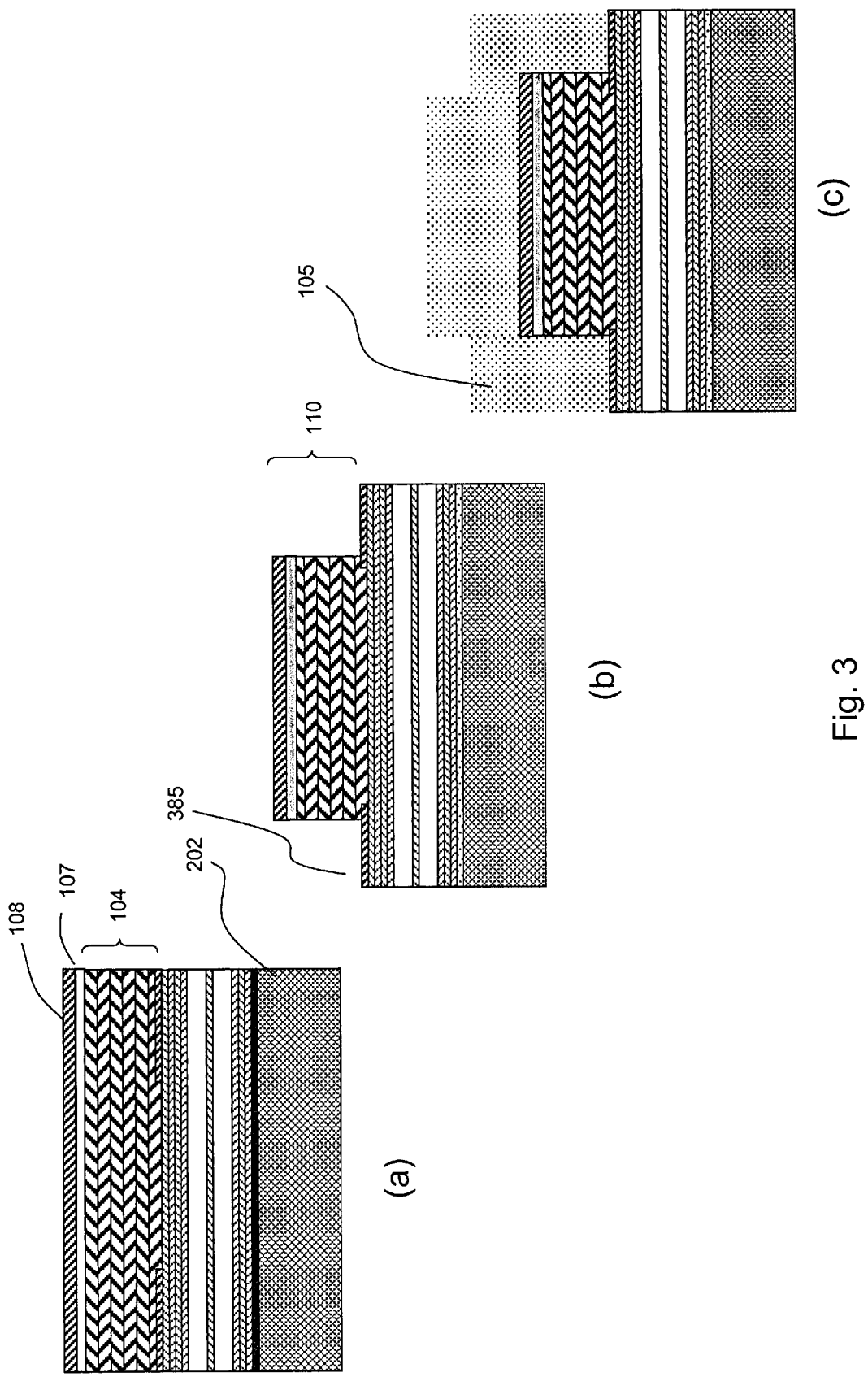
Figure 4:
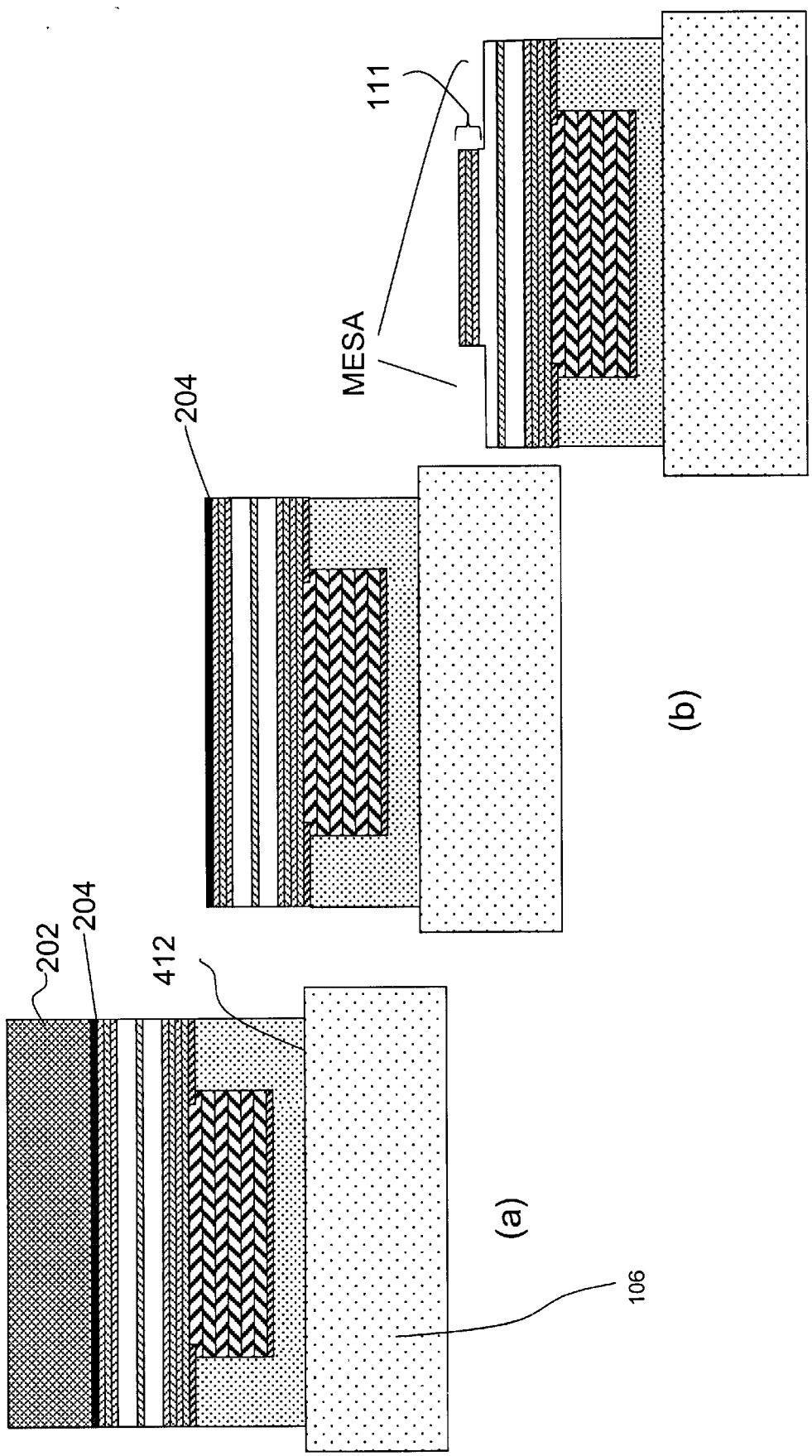
Figure 5:
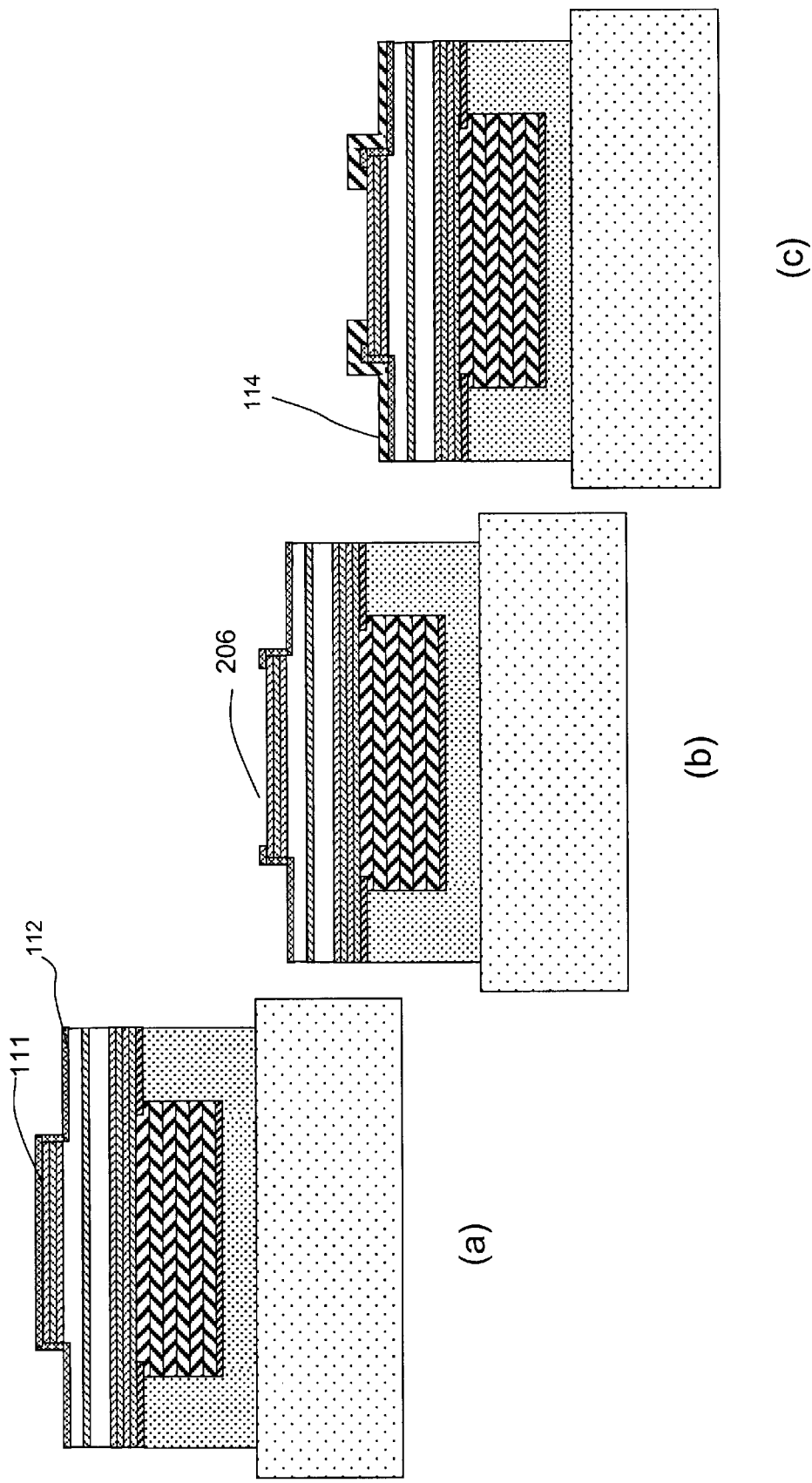
Figure 6:
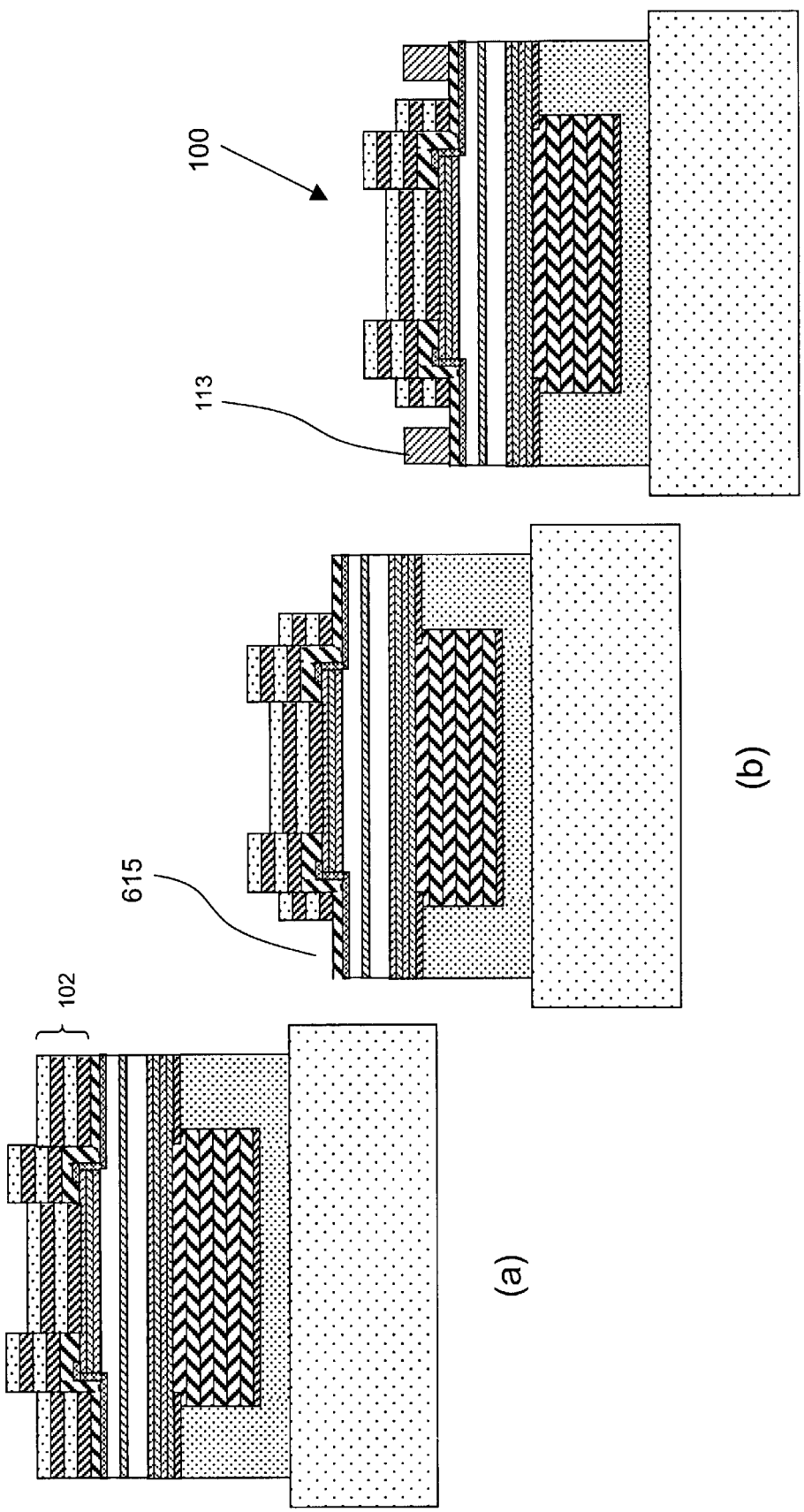

The elements shown in the Figures are not drawn to scale. Referring now to FIG. 1, there is shown a cross-sectional view of an exemplary embodiment of a VCSEL structure 100 according to the present invention. Epitaxially grown layers of VCSEL 100 may be fabricated with epitaxial growth techniques such as molecular beam epitaxy (MBE), liquid phase epitaxy (LPE), a vapor phase epitaxy (VPE) process such as or metalorganic chemical vapor deposition (MOCVD, also known as MOVPE), or other known crystal growth processes. Other layers may be deposited with non-epitaxial deposition techniques such as e-beam evaporation, thermal evaporation, or sputtering.

VCSEL structure 100 comprises a top cavity mirror (comprising top dielectric DBR 102), a bottom cavity mirror 110 (comprising bottom dielectric DBR 104 and bottom metal mirror 108), and an active region 115 disposed between the top and bottom cavity mirrors. The denotations "top" and "bottom" are employed for orientation purposes, e.g. bottom denotes the mirror between the support substrate or submount 106 and the active region. The top cavity mirror, in particular top dielectric DBR 102, is the exit mirror.

The bottom mirror 110 comprises, between the bottom DBR 104 and metal mirror 108, a phase-shift or phase-matching layer 107. A bottom semiconductor DBR/current-spreading layer 116 is disposed between the active region and bottom DBR 104, and a top semiconductor DBR/current-spreading layer 111 is disposed between the top DBR 102 and the active region.

Current-spreading layers 111, 116 are grown as semiconductor DBR structures in the illustrated embodiment instead of other semiconductor layer structures, e.g. because it is believed that semiconductor DBR structures can have improved current-spreading properties in the context of the present invention. For example, a semiconductor DBR will have comparatively higher vertical resistance, which is conducive to lateral current spreading from the center of the active region (above the non-conducting DBR 104) which is desired in order to efficiently spread current from the active region, laterally through DBR 116 to the conducting backside contact metal layer 117. In alternative embodiments current-spreading layers 111, 116 need not be multilayer or DBR structures.

The primary reflectivity of the top cavity mirror is provided by top DBR 102; top semiconductor DBR/current-spreading layer 111 may add a small amount of reflectivity to the top cavity mirror, but its main purpose is to spread (conduct) current. Similarly, the primary reflectivity of the bottom cavity mirror 110 is provided by bottom DBR 104/bottom metal mirror 108 combination (enhanced by the effect of phase-shift layer 107, as described below); bottom semiconductor DBR/current-spreading layer 116 may add a small amount of reflectivity to the bottom cavity mirror 110, but its primary purpose is to spread current. Bottom semiconductor DBR/current-spreading layer 116 may thus be considered to be part of bottom cavity-mirror 110, albeit a fairly insignificant part for reflectivity purposes. Alternatively, since virtually all of the reflectance provided by bottom DBR 104 and bottom metal mirror 108, the bottom cavity mirror 110 may also be considered to consist of these layers but not current-spreading DBR 116. In alternative embodiments in which current-spreading layers 111, 116 are not multilayer or DBR structures, they should not be considered part of the top and bottom cavity mirrors at all.

An annular metal bonding pad 113 is disposed on top metal contact layer 114, which is insulated from the active region by passivation (insulating) layer 112. Pumping current therefore flows from pad 113, through top metal contact layer 114 and into the top, annular perimeter region of current-spreading DBR layer 111. In this application, "annular" means a three-dimensional shape surrounding a center opening or section. This includes ring-shaped and torus or toroid-shaped regions, as well as a substantially cylindrical shape minus an interior, concentric substantially cylindrical shape. Other shapes are possible as well, e.g. square, rectangular, or elliptical shaped toroids. A substantially flat or planar layer may also be described as annular if it has a washer type shape, or even non-circular type shapes such as a square section with a square or other-shaped central opening.

Bottom DBR 104, phase-matching layer 107, and metal mirror 108 (i.e., the primary components of bottom mirror 110) are disposed within a metal bonding layer 105, which is disposed on, and electrically coupled to, submount 106. Submount preferably has a metal surface suitable for bonding with metal bonding layer 105, e.g. it may be a substrate coated with a metal surface. Submount 106 may be, for example, an n-type Si material coated with a suitable coating for wafer bonding with metal bonding layer 105. Although silicon is used as a convenient support submount 106, other materials could used instead, such as GaAs, GaP, InP, sapphire, silicon carbide (SiC), diamond, and the like. The metal bonding layer 105 surrounds and includes a mesa-shaped bottom mirror portion (consisting of layer 104, 107, 108). As will be appreciated, this portion has sidewalls, which may be approximately normal to the plane of epitaxial growth, but which typically will have a taper or angle, so that the shape is a mesa shape, often with a circular cross section, although other cross sectional shapes are possible. When the mesa has a circular cross section, it may have a somewhat cylindrical shape, although the side walls will typically be tapered from "vertical" to some degree (where vertical is the orientation orthogonal or perpendicular to the plane of epitaxial growth).

Metal bonding layer 105 has a substantially flat annular top surface, on which patterned metal layer 117 is disposed, substantially outside and around the mesa-shaped bottom mirror portion within the metal bonding layer 105. Metal bonding layer 105 thus electrically contacts patterned metal layer 117. Thus, pumping current flows from the active region 115, largely laterally through bottom current-spreading DBR 116 and through backside contact metal layer 117, into metal bonding layer 105 (around substantially nonconducting dielectric DBR 104) and then into submount 106.

Active region 115 is thus located within the laser cavity, and is designed to, and has a material that is capable, of stimulated emission at one or more wavelengths of light, including a lasing wavelength (operating frequency). I.e., the active region comprises a population inversion region for producing coherent laser radiation. For example, the optical gain of the active region in a VCSEL may be provided by quantum wells. Each quantum well has a gain spectrum with a single peak wavelength, and some spectral width over which gain is present.

The top and bottom laser cavity mirrors, in particular the top and bottom DBRs 102, 104, must have sufficient reflectance at the lasing wavelength to permit lasing to occur. Thus, these DBRs are preferably designed with an appropriate layer structure and material system so that they have reflectance bands which include the lasing wavelength. That is, these DBRs typically have a primary reflectance band, which is roughly centered on the lasing wavelength, and/or the reflectance of the DBRs at the lasing wavelength is substantially the maximum reflectance exhibited by the DBR. The reflectance band of the DBR refers to the wavelength band over which the DBR has a reflectance substantially equal to its maximum or peak reflectance, which maximum reflectance is also within the reflectance band and at or near the center wavelength of the reflectance band. In the present application, the term DBR refers to any distributed reflector structure with multiple layers of varying, alternating refractive index giving rise to the desired high-reflectivity band required in the VCSEL cavity.

In an embodiment, top DBR 102 has an optical thickness in each layer of one-quarter wavelength ($\lambda 4$, also known as quarter-wavelength optical thickness (QWOT)) at the desired lasing wavelength, and a sufficient number of mirror pairs of sufficient refractive index contrast, to provide the desired exit mirror reflectance (e.g., approximately 99%) at the equivalent (lasing) wavelength. This frequency can correspond to a wavelength of about 1.55 $\mu$m in air, for example, for telecommunications applications. Because heat preferably is not removed through the top DBR 102, the thermal property requirements of the top DBR 102 are not as stringent compared to the bottom DBR. This may permit higher refractive index contrast materials, albeit with poorer thermal conductivity, to be employed. If, however, in alternative embodiments, heat is removed through the top DBR, then thermal properties become more important to device operation.

Bottom dielectric DBR 104 also has an optical thickness in each layer of one-quarter wavelength ($\lambda$/4) at the desired lasing wavelength, and a sufficient number of mirror pairs of sufficient refractive index contrast, to provide a sufficient back mirror reflectance (e.g., at least approximately 99.9%) at the lasing wavelength, and has sufficient thermal conductivity for heat removal. The effective thermal conductivity of the bottom DBR 104 depends on its total thickness, the surface area in contact with a metal bonding layer 105 (which is in turn in contact with a submount 106), and the thermal conductivity of the individual layers of the bottom DBR 104. Therefore, in an embodiment dielectric materials employed in bottom DBR 104 are selected that have good thermal properties as well as widely differing refractive indices. Large differences in the refractive index of the alternating stacked layers permit fewer DBR pairs to be used to achieve a given reflectance. Fewer pairs also provide lower interface scattering losses in the bottom DBR 104 and help to reduce stress cracks in the layers comprising the stacks. Similar considerations are employed in selecting the materials and structure of top DBR 102, although as noted above the thermal property requirements of top DBR 102 may not be as critical as for bottom DBR 104.

Additionally, the extinction coefficient (ie., absorption) of the dielectric materials comprising the top DBR 102 or bottom DBR 104 is preferably zero or approximately zero at the wavelength of interest (e.g., emission wavelengths around 1.55 $\mu$m, 1.310 $\mu$m, or other desirable wavelengths). The porosity of the dielectric materials preferably is sufficiently low so as to avoid or reduce changes in refractive index from moisture in porous voids, to improve adhesion and reliability/stability, to reduce or avoid absorption losses, and to improve thermal conductivity. Further, the thermal expansion properties of the layers of the top DBR 102 and the bottom DBR 104 preferably are matched to other layers within the VCSEL structure 100 for improved reliability.

The top DBR 102 may be constructed of, e.g., 2 dielectric material ($\alpha$-Si/SiO$_2$) mirror pairs, to fulfill the above reflectance and other requirements. In such an embodiment, top DBR 102 is constructed of alternating layers of $\alpha$-Si (silicon) and SiO$_2$ (silicon dioxide), because of the comparatively large differences in the refractive index of the alternating stacked layers that are achievable in this material system. Although this DBR material system has lower thermal conductivity than alternative material systems with lower refractive index contrast (such as Al$_x$O$_y$/$\alpha$-Si), it may be preferred for the top DBR 102 since heat is not removed through it in some embodiments. With such a design, 2 mirror pairs can suffice to provide 99% reflectance, which can be sufficient for the exit mirror reflectance for the VCSEL design. Additionally, patterning of $\alpha$-Si/SiO$_2$ materials can be done using well established semiconductor fabrication technologies, e.g. it may be easier to etch this material system.

Alternatively, top DBR 102 can employ other mirror pair material systems, e.g. SiO$_2$/Ta$_2$O$_5$, Al$_x$O$_y$/Ta$_2$O$_5$, and the like. For example, instead of a 2 mirror pair $\alpha$-Si/SiO$_2$ DBR, top DBR 102 may be a 3.5 pair SiO$_2$/Ta$_2$O$_5$ DBR, patterned via a suitable lift-off process.

The bottom cavity mirror may consist of a combination of a dielectric DBR and metal mirror, as described above. The presence of metal mirror 108 accounts for part of the reflectance of bottom cavity mirror 110 and reduces the number of mirror pairs needed in bottom DBR 104 to provide the desired overall bottom mirror reflectance (e.g., 99.9%). Nevertheless, because bottom DBR 104 needs to be constructed from a dielectric mirror pair material system having greater thermal conductivity, and thus lower refractive index contrast, than is required for top DBR 102, and because bottom mirror 110 needs to have greater reflectance than top DBR 102 (e.g., 99.9% versus 99%), a larger number of pairs may be required for the bottom DBR 104 than for the top DBR 102.

In an embodiment, metal mirror 108 is an aluminum layer, and bottom DBR 104 comprises 3 mirror pairs of QWOT aluminum oxide and silicon layers (e.g.,Al$_2$O$_3$/$\alpha$-Si or, in general,Al$_x$O$_y$/$\alpha$Si). Alternatively, bottom DBR 104 can employ other mirror pair material systems, e.g. SiO$_2$/Ta$_2$O$_5$ or Al$_x$O$_y$/Ta$_2$O$_5$, and the like.

When a metal mirror 108 is employed along with DBR mirror pairs to provide a composite reflector, there can be lack of phase matching between the DBR portion and the metal mirror. Therefore, phase-shift layer 107 is employed, preferably disposed between these layers, to adjust the phase of the standing wave, so that reflections are phase matched at the lasing wavelength. The presence of phase-shift layer 107 thus helps to maximize or improve the overall reflectivity of the composite mirror 110. Phase-shift layer 107 may thus be considered to be part of bottom cavity mirror 110, since it plays a role in the overall reflectance attained by the DBR 104/metal mirror 108 combination. Phase-shift layer 107 may be constructed of SiO$_2$ or other suitable dielectric or even semiconductor materials, such as Al$_2$O$_3$ or $\alpha$-Si, and preferably has a suitable thickness and material system to achieve the desired phase matching at a given lasing wavelength, and depending on what material is used for the metal mirror. The presence of phase-shift layer 107 is optional; the desirability for this layer will depend on whether a phase-shift is required and/or desirable to adjust the phase of the standing wave, so that reflections are phase matched at the lasing wavelength, as described above with reference to FIG. 1.

As noted above, unlike the layers of the 3 Al$_2$O$_3$/$\alpha$-Si mirror pairs of DBR 104, phase-shift layer 107 is not necessarily QWOT. Bottom DBR 104 may therefore be regarded as separate from the phase-shift layer. Alternatively, bottom DBR 104 may be considered to be a hybrid or composite DBR having 3.5 mirror pairs, that is, having 3 dielectric DBR mirror pairs (i.e., with dielectric QWOT layers) and a phase-shift layer (the "0.5" layer, which is not necessarily a standard QWOT dielectric DBR mirror-pair layer).

The bottom DBR 104 and the metal mirror 108, along with phase-matching layer 107, form a composite metal/DBR dielectric bottom mirror 110 that provides sufficient thermal, reflection, and chemical stability properties to achieve good VCSEL performance. In alternative embodiments, other compounds, such as aluminum nitride (AlN), zinc oxide (ZnO), magnesium oxide (MgO), beryllium oxide (BeO),-and the like could be used instead as the dielectric materials for the bottom DBR 104 mirror pair layers. These materials have good or even better thermal properties than mirror pair materials such as Al$_2$O$_3$/$\alpha$-Si. The top DBR 102 also can be constructed of any suitable dielectric or semiconductor materials, including those listed above, as will be appreciated by those skilled in the art. Any metal having sufficient reflectance, low absorption, and good adhesion properties, such as silver (Ag), can be used as the metal mirror 108.

Although 2 and 3.5 pair layers have been illustrated for the DBRs 102 and 104, respectively, as will be appreciated by those skilled in the art, different numbers of pair layers could be used for these DBRs, depending on constraints, design, or application requirements.

In fabricating the VCSEL structure 100, the bottom DBR/metal mirror structure 110 is wafer bonded to the suitable submount 106, using the metal bonding layer 105. Wafer bonding is used to remove heat. More specifically, void-free or nearly void-free bonding is desirable without degrading the total reflectance of the structure. Care must be taken to avoid destroying or damaging the metal mirror 108 and/or the dielectric top DBR 102 while wafer bonding the structure to the submount 106. Also, throughout the entire fabrication process the integrity of the DBR/metal mirror structure 110 should be maintained, which can be accomplished by employing suitable metallurgy.

Referring now to FIGS. 2–6, a method for fabricating VCSEL structure 100 of FIG. 1 is schematically depicted, in accordance with another embodiment of the invention. Other methods also are included within the scope and spirit of the present invention. FIGS. 2–6 also show more details of the layer structure of the VCSEL 100 of FIG. 1.

Referring now to FIG. 2(a), starting with an initial epitaxial growth substrate 202 (e.g., InP), an etch stop layer 204 (e.g., indium-gallium-arsenide (InGaAs)) is first grown, followed by growth of a top (relative to the final VCSEL structure 100) semiconductor multilayer (DBR) stack 111, which is used primarily as a hole current-spreading layer (e.g., p-type InP), as described above. The layers are grown using, for example, MBE. As described above, layer 111 can be a semiconductor DBR current-spreading layer, having multiple semiconductor layers with alternating material properties. For example, top semiconductor DBR/current-spreading layer 111 can be a 1.5 mirror pair InP/InGaAsP DBR. Other numbers of mirror pairs may be employed in alternative embodiments. This is followed by growth of the laser active (gain) region 115, which may comprise confinement structures (e.g., it may include $In_xGa_{1-x}As_yP_{1-y}$, where x and y vary from approximately 0 to approximately 1), and then a bottom semiconductor multilayer stack (DBR)/current-spreading layer 116.

Bottom semiconductor DBR/current-spreading layer 116 is a multilayer DBR stack constructed of multiple semiconductor layers with alternating material properties and having, e.g., an electron current spreading layer (e.g., n-type InP). In an embodiment, bottom current-spreading DBR 116 may have a similar DBR structure to top current-spreading DBR 111. DBR 116 is used primarily for current spreading, as described above. As shown in FIG. 2(b), a patterned metal layer 117 (e.g., gold-germanium-nickel-gold (AuGeINi/Au)) then is deposited and alloyed at 380° C. to form an n-type backside contact. Metal contact layer 117 may be deposited via a lift-off process, atterned to have a substantially annular shape, on the outer perimeter of the surface of the current-spreading layer 116, with a circular opening over the active region and transverse optical cavity. As will be appreciated, metal contact layer 117 is employed for conducting pumping current from active region, around bottom DBR 104 via metal bonding layer 105, to submount 106, because bottom dielectric DBR 104 is not conductive.

Next, in the disclosed embodiment of FIG. 3(a), a patterned dielectric DBR 104 is deposited. The materials used can be alternating layers of $Al_2O_3$ and Si, for example. In an embodiment, as shown in FIG. 3(a), a phase-matching or phase-shift layer 107 such as a dielectric layer (e.g., $SiO_2$) is deposited next, followed by deposition of a metal mirror 108. Metal reflector 108 deposited on DBR 104 may be a 2000 A thick layer of Al, for example.

FIG. 3(b) shows an annular region 385 where part of the bottom mirror layers (i.e., DBR 104, phase-shift layer 107, metal mirror 108) are removed to form bottom mirror section 110, which may be termed a mesa. This can be done through etching or through a lift-off process, e.g. The etched or patterned section or mesa 110, as described above, will have sidewalls which are typically tapered, due to the patterning process, at some angle away from normal to the plane of epitaxial growth. In general, the shape may be considered to be a mesa shape, having side walls at some angle with respect to the plane of epitaxial growth, with a certain cross section, such as circular, square, rectangular, octagonal, and the like.

Deposition of a metal bonding layer 105, such as a few microns of In on top of TiPtAu, follows this, as illustrated in FIG. 3(c). The metal bonding layer is deposited on the mesa-shaped mirror portion 110 (including its "bottom" surface and its side walls, for heat conduction, e.g.) and on the annular metal layer 117 for both heat and electrical conduction. The metal bonding layer thus surrounds the etched, bottom mirror portion mesa 110 and electrically contacts the patterned metal layer 117 to permit current to be spread through the patterned metal layer 117 and into metal bonding layer 105 (around nonconducting dielectric DBR 104), and then into the supporting submount. Although DBR 104 is electrically nonconducting, it has some thermal conductivity, and therefore heat from the active region is conducted both into metal bonding layer 105 through metal layer 117, and through DBR 104, into metal bonding layer 105 at the sidewalls and bottom side (though metal mirror 108).

The portion of the VCSEL structure 100 being grown and fabricated so far then is placed into contact with a metal bonding surface of a submount 106, which acts as a mechanical supporting submount and heat spreading layer, and heated to 175° C. for bonding. The wafer submount 106 should be flat and have good thermal conductivity, and a metal bonding surface. In an embodiment, an alloy process is employed as part of the wafer bonding procedure, to bond the VCSEL structure, at its bottom end, via metal bonding layer 105, to submount 106. In an embodiment, submount 106 comprises an n-type silicon wafer coated at a surface 412 with an appropriate metal alloy (e.g., Ti/Pt/Au/In) before physical contact is made between metal bonding layer 105 of the VCSEL structure 100, and submount 106. In general, submount 106 may be formed of a combination of various metal and semiconductor layers, for example, Ti/Pt/Au/In/Au/Pt/Ti/Si layers arranged in a specific order, and with a specific thickness. The Ti, Pt, and Au layers can be typically on the order of a few hundred angstroms (e.g., approximately 100 Å to approximately 300 Å), the In layer can be typically on the order of approximately 1 micron to a few micron (e.g., approximately 1 to approximately 10 $\mu$m), and the Si layer can be any typical thickness for a Si substrate known in the art or another value depending on any constraints or design or application requirements. Other submount configurations are also possible.

As noted above, metal bonding layer 105 may comprise a layer of In on top of Ti/Pt/Au. Metal bonding layer 105 is placed in physical contact with coated surface 412 of submount 106, and the sample is then heated above the melting point of Indium, preventing the intermixing of the bonding metals from forming an alloy that will itself alloy with the mirror 108 (e.g., aluminum). Such an alloy likely would negatively impact reflectance and cause the metal bond to be too brittle. Poor mirror reflectance can degrade or even prevent laser action and a brittle metal bond will impair reliability.

In alternative embodiments, metals, layer structures or alloys other than Ti/Pt/Au/In can be used for the wafer bonding step, e.g. palladium-indium (PdIn), because the bonding temperature is lower and the resulting PdIn$_3$ alloy has better thermal stability.

The metal bonding of metal bonding layer 105 with submount 106, to thereby bond the VCSEL structure at its "bottom" end with a submount 106, results in the structure depicted in FIG. 4(a). Following this wafer bonding step, the original epitaxial growth substrate 202 is chemically removed, as shown in FIG. 4(b), with an etchant that does not remove away etch stop layer 204. As shown in FIG. 4(c), the etch stop layer 204 is removed by selective etching, and a mesa is etched into the layer 111. Depending on the particular etching process used, etch-stop layer 204 may function in different ways. As will be appreciated, the selective etching is, in an embodiment, a two-step process, in which substrate 202 is first etched with an etchant that does not etch layer 204, followed by an etchant that etches away etch stop layer 204 without etching or damaging any other layers. In another embodiment, etch-stop layer 204 may be a layer which etches rapidly as compared to the substrate 202. In such an embodiment, layer 204 may be preferentially etched away, thereby releasing the remaining portion portion from substrate 202. Such preferential etching may in some embodiments include prior oxidation of layer 204.

As illustrated in FIG. 5(a), an insulating layer 112 is then deposited, such as SiO$_x$N$_Y$, where x and y refer to the composition of oxygen and nitrogen, respectively. A substantially circular portion of the insulating layer, directly above the active region and laser cavity, is then removed by etching or lift-off, as shown in FIG. 5(b). A patterned top metal contact layer 114 is then deposited, as shown in FIG. 5(c), which can be a combination of metals such as Ti/Pt/Au. Over this, as shown in FIG. 6(a), top DBR 102 is deposited (e.g., the dielectric DBR 102 of FIG. 1), and patterned to permit contact to the metal contact layer 114 (e.g., p-type). As described above, DBR 102 in an embodiment is a 2 mirror pair Si/SiO$_2$ DBR. FIG. 6(b) shows an annular region 615 where the top reflector is removed, e.g. via etching or lift-off. A bonding pad 113 is then deposited, as shown in FIG. 6(c), which is used to increase the metal thickness for better wirebonding.

The structure can be inverted, but performance may degrade due to hole transport limitations. Also, a structure similar to that of VCSEL 100 may be used, but modified so that light is removed from the bottom (substrate-side), provided the top DBR 102 has a metal mirror and the bottom DBR 104. does not. This would be a non-wafer-bonded structure from which light is removed through the substrate.

Preferably, the bonded VCSEL mirror 108 of the present invention is capable of supporting heat removal, while at the same time the integrity of its reflectance is maintained throughout the bonding process. Thus, because bottom DBR 104 also preferably has good thermal conductivity, heat conducted from the active region into the bottom DBR could be spread out through the bottom, through mirror 108, into metal bonding layer 105, as well as through DBR 104's sidewalls, into metal bonding layer 105.

In an alternative embodiment, the bottom cavity mirror 110 comprises a dielectric DBR and metal mirror combination as described above, however without the presence of a phase-shift layer 107. In yet another embodiment, the bottom cavity mirror 110 comprises only a dielectric DBR, but no metal mirror nor phase-shift layer 107. In this embodiment, a sufficient number of mirror pairs are provided in the bottom DBR 104 to provide the desired reflectance (e.g., 99.9%). As will be appreciated, this number of mirror pairs will be greater than that needed if a bottom DBR is combined with a metal mirror.

Turning now to some possible, but non-limiting, applications, U.S. Pat. No. 5,901,168 describes a QC (quantum cascade) laser, the entirety of which is incorporated herein by reference. Like the QC laser in that patent, the VCSEL structure 100 when incorporated into a VCSEL, in accordance with embodiments of the present invention, can be used in various applications, including optical communications (e.g., fiber, telecom, datacom, free space, and the like), and absorption spectroscopy (e.g., biosensing, molecular, chemical, isotropic, and the like).

Lasers constructed of the VCSEL structure 100 according to the invention have properties that will make them useful in many applications, for example, those for which the laser in the aforementioned U.S. Pat. No. 5,901,168 are useful. For instance, these lasers can be advantageously used for trace gas analysis for environmental applications, automotive emission sensors, combustion diagnostics, industrial process control, medical applications or collision avoidance radar for aircraft or automobiles, and others. In general, these lasers can be used advantageously in point sensing apparatus as well as in remote sensing apparatus.

It will be understood that various changes in the details, materials, and arrangements of the parts which have been described and illustrated above in order to explain the nature of this invention may be made by those skilled in the art without departing from the principle and scope of the invention as recited in the following claims.

What is claimed is:

1. A vertical-cavity surface-emitting laser (VCSEL) structure comprising:
    a metal bonding layer disposed on a submount at a bottom side of the metal bonding layer;
    a bottom cavity mirror comprising a bottom dielectric distributed Bragg reflector (DBR) disposed within the metal bonding layer, the bottom dielectric DBR having a reflectance band including the lasing wavelength;
    a bottom current-spreading layer disposed on said bottom dielectric DBR and on a substantially flat, annular top surface of said metal bonding layer;
    a semiconductor active region disposed on the bottom current-spreading layer, said active region capable of stimulated emission at the lasing wavelength; and
    a top cavity mirror disposed above the active region and having a reflectance band including the lasing wavelength.

2. The VCSEL structure of claim 1, the bottom cavity mirror further comprising a metal mirror layer disposed beneath the bottom dielectric DBR, within the metal bonding layer, such that the bottom dielectric DBR and metal mirror layer form a composite metal and dielectric DBR mirror having an overall reflectance greater than the reflectance of either the bottom dielectric DBR or the metal mirror layer.

3. The VCSEL structure of claim 2, further comprising a phase-shift layer disposed between said metal mirror layer and a bottom side of said bottom dielectric DBR for adjusting the standing wave so that reflections from the metal mirror layer and the bottom dielectric DBR are phase matched at the lasing wavelength.

4. The VCSEL structure of claim 3, wherein the phase-shift layer comprises $SiO_2$.

5. The VCSEL structure of claim 2, wherein said metal mirror layer comprises Al.

6. The VCSEL structure of claim 1, further comprising an annular contact metal layer disposed between said bottom current-spreading layer and annular top surface of said metal bonding layer.

7. The VCSEL structure of claim 1, wherein the top cavity mirror comprises a top DBR, the VCSEL structure further comprising:
   a top current-spreading layer disposed directly between said top DBR and said active region.

8. The VCSEL structure of claim 7, further comprising:
   an annular insulating layer disposed on an annular top surface of said active region;
   an annular top metal contact layer disposed on said annular insulating layer and electrically contacting an annular surface of said top current-spreading layer; and;
   an annular metal bonding pad disposed on said annular top metal contact layer.

9. The VCSEL structure of claim 7, wherein said top DBR is a top dielectric DBR.

10. The VCSEL structure of claim 9, wherein said top dielectric DBR comprises a 2 mirror pair $\alpha$-Si/$SiO_2$ DBR, each layer of said top dielectric DBR having approximately a quarter-wavelength optical thickness at the lasing wavelength.

11. The VCSEL structure of claim 7, wherein said top current-spreading layer is a semiconductor DBR structure.

12. The VCSEL structure of claim 1, wherein said bottom dielectric DBR comprises a 3 mirror pair $Al_2O_3$/$\alpha$-Si DBR, each layer of said bottom dielectric DBR having approximately a quarter-wavelength optical thickness at the lasing wavelength.

13. The VCSEL structure of claim 1, wherein the bottom current-spreading layer is a semiconductor DBR structure.

14. The VCSEL structure of claim 13, wherein the bottom current-spreading layer comprises a InP/InGaAsP DBR structure.

15. The VCSEL structure of claim 1, wherein said top cavity mirror has lower reflectance than said bottom cavity mirror, whereby said top cavity mirror is an exit mirror.

16. The VCSEL structure of claim 15, wherein said top cavity mirror has a reflectance of at least about 99% and said bottom cavity mirror has a reflectance of at least about 99.9%.

17. The VCSEL structure of claim 1, wherein said bottom dielectric DBR has a maximum reflectance within the reflectance band and has a reflectance at the lasing wavelength substantially equal to the maximum reflectance.

18. The VCSEL structure of claim 1, wherein said submount comprises a substrate having a metal coating disposed on a top surface thereof, said metal coating disposed between and bonded to said metal bonding layer.

19. A method for fabricating a VCSEL structure, comprising the steps of:
   (a) epitaxially growing: an etch stop layer on the substrate, a top current-spreading layer on the etch stop layer, a semiconductor active region on the top current-spreading layer, and a bottom current-spreading layer on the active region, said active region being capable of stimulated emission at a lasing wavelength;
   (b) forming an annular contact metal layer on said bottom current-spreading layer, said annular contact metal layer having a central opening;
   (c) depositing a bottom dielectric DBR on said annular contact metal layer and, through the central opening of the annular contact metal layer, on said bottom current-spreading layer;
   (d) removing a portion of the bottom dielectric DBR to expose an annular surface of the annular contact metal layer and forming a bottom dielectric DBR mesa having side walls;
   (e) depositing a metal bonding layer covering the bottom dielectric DBR mesa and contacting the exposed annular surface of the annular contact metal layer;
   (f) applying heat to bond the metal bonding layer to a metal surface of a submount; and
   (g) applying selective etching to remove the substrate and then the etch stop layer.

20. The method of claim 19, comprising the further step of:
   (e) forming a top cavity mirror on the top current-spreading layer, said top cavity mirror having a reflectance band including the lasing wavelength.

21. The method of claim 20, wherein step (e) comprises the further steps of:
   patterning the top current-spreading layer to provide a mesa-shaped top current-spreading layer and to expose an annular top surface of said active region;
   forming an annular insulating layer on the annular top surface of said active region;
   forming an annular top metal contact layer on said annular insulating layer and electrically contacting an annular surface of said top current-spreading layer; and
   forming an annular metal bonding pad on said annular top metal contact layer.

22. The method of claim 20, wherein said top cavity mirror comprises a top dielectric DBR.

23. The method of claim 20, wherein said top cavity mirror has lower reflectance than a bottom cavity mirror comprising the bottom dielectric DBR, whereby said top cavity mirror is an exit mirror.

24. The method of claim 23, wherein said top cavity mirror has a reflectance of at least about 99% and said bottom-cavity mirror has a reflectance of at least about 99.9%.

25. The method of claim 19, wherein:
   step (c) comprises the further step of depositing a metal mirror layer on the bottom dielectric DBR, whereby the bottom dielectric DBR and metal mirror layer form a composite metal and dielectric DBR mirror having an overall reflectance greater than the reflectance of either the bottom dielectric DBR or the metal mirror layer, whereby said composite metal and dielectric DBR mirror provides a bottom cavity mirror for said VCSEL structure;
   step (d) comprises the step of removing a portion of the bottom dielectric DBR and metal mirror layer to expose an annular surface of the annular contact metal layer and forming a bottom cavity mirror mesa having side walls; and
   step (e) comprises the step of depositing the metal bonding layer covering the bottom cavity mirror mesa and contacting the exposed annular surface of the annular contact metal layer.

26. The method of claim 25, wherein step (c) comprises the further step of depositing a phase-shift layer on the bottom dielectric DBR and depositing the metal mirror layer on the phase-shift layer so that the phase-shift layer is disposed between the dielectric DBR and the metal mirror layer, wherein the phase-shift layer is for adjusting the standing wave so that reflections from the metal mirror layer and the bottom dielectric DBR are phase matched at the lasing wavelength, wherein said bottom cavity mirror mesa comprises said bottom dielectric DBR, said phase-shift layer, and said metal mirror layer.

27. The method of claim 26, wherein the phase-shift layer comprises $SiO_2$ and said metal mirror layer comprises Al.

28. The method of claim 19, wherein said top and bottom current-spreading layers are semiconductor DBR structures.

29. The method of claim 28, wherein the bottom current-spreading layer comprises a InP/InGaAsP DBR structure.

30. The method of claim 19, wherein said bottom dielectric DBR comprises a 3 mirror pair $Al_2O_3/\alpha$-Si DBR, each layer of said bottom dielectric DBR having approximately a quarter-wavelength optical thickness at the lasing wavelength.

* * * * *